US008823163B2

(12) United States Patent
Drake et al.

(10) Patent No.: US 8,823,163 B2
(45) Date of Patent: Sep. 2, 2014

(54) ANTIMONY-FREE GLASS, ANTIMONY-FREE FRIT AND A GLASS PACKAGE THAT IS HERMETICALLY SEALED WITH THE FRIT

(71) Applicant: Corning Incorporated, Corning, NY (US)

(72) Inventors: Melinda Ann Drake, Corning, NY (US); Robert Michael Morena, Lindley, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/014,525

(22) Filed: Aug. 30, 2013

(65) Prior Publication Data

US 2014/0061623 A1    Mar. 6, 2014

Related U.S. Application Data

(60) Provisional application No. 61/695,033, filed on Aug. 30, 2012.

(51) Int. Cl.
| | |
|---|---|
| *H01L 23/00* | (2006.01) |
| *H01L 51/52* | (2006.01) |
| *B32B 17/06* | (2006.01) |
| *C03C 8/00* | (2006.01) |
| *C03C 3/21* | (2006.01) |
| *C03C 8/24* | (2006.01) |

(52) U.S. Cl.
CPC ............ *B32B 17/06* (2013.01); *H01L 51/5237* (2013.01); *H01L 51/5246* (2013.01); *H01L 51/524* (2013.01); *C03C 8/00* (2013.01); *C03C 3/21* (2013.01); *C03C 8/24* (2013.01)
USPC ................ 257/703; 428/426; 501/17; 501/18

(58) Field of Classification Search
CPC ... H01L 51/5246; H01L 51/5237; C03C 3/21; C03C 8/02; C03C 8/12; C03C 8/24
USPC ......................... 257/703; 428/426; 501/17, 18
See application file for complete search history.

(56) References Cited

U.S. PATENT DOCUMENTS

| 4,748,127 A | 5/1988 | Nigrin .............................. 501/46 |
| 4,814,298 A | 3/1989 | Nelson et al. .................... 501/17 |

(Continued)

FOREIGN PATENT DOCUMENTS

| JP | 58-211743 | 9/1983 |
| JP | 62-078128 | 4/1987 |

(Continued)

OTHER PUBLICATIONS

Glass Science and Technology ,Milos B. Volf—article—Chemical approach to Glass; Amsterdam, Oxford, NY Tokyo—1984.

(Continued)

*Primary Examiner* — Tu-Tu Ho
(74) *Attorney, Agent, or Firm* — Kevin M. Able

(57) ABSTRACT

An antimony-free glass comprising $TeO_2$ and/or $Bi_2O_3$ suitable for use in a frit for producing a hermetically sealed glass package is described. The hermetically sealed glass package, such as an OLED display device, is manufactured by providing a first glass substrate plate and a second glass substrate plate and depositing the antimony-free frit onto the first substrate plate. OLEDs may be deposited on the second glass substrate plate. An irradiation source (e.g., laser, infrared light) is then used to heat the frit which melts and forms a hermetic seal that connects the first glass substrate plate to the second glass substrate plate and also protects the OLEDs disposed therein. The antimony-free glass has excellent aqueous durability, good flow, and low glass transition temperature.

18 Claims, 3 Drawing Sheets

(56) References Cited

U.S. PATENT DOCUMENTS

| | | | | |
|---|---|---|---|---|
| 5,246,890 A | 9/1993 | Aitken et al. | | 501/15 |
| 5,281,560 A | 1/1994 | Francis et al. | | 501/15 |
| 5,514,629 A | 5/1996 | Morena | | 501/15 |
| 5,516,733 A | 5/1996 | Morena | | 501/15 |
| 5,733,828 A | 3/1998 | Usui et al. | | 501/17 |
| 6,048,811 A | 4/2000 | Morena | | 501/15 |
| 6,069,099 A | 5/2000 | Fewkes et al. | | 501/15 |
| 6,291,092 B1 | 9/2001 | Kohli et al. | | 429/33 |
| 6,737,375 B2 | 5/2004 | Buhrmaster et al. | | 501/47 |
| 7,189,470 B2 | 3/2007 | Cortright et al. | | 429/35 |
| 7,214,441 B2 | 5/2007 | Cortright et al. | | 429/35 |
| 7,341,964 B2 | 3/2008 | Emlemdi | | 501/26 |
| 7,385,347 B2 | 6/2008 | Song et al. | | 313/504 |
| 7,425,518 B2 | 9/2008 | Yoshida et al. | | 501/15 |
| 7,435,695 B2 | 10/2008 | Hormadaly | | 501/45 |
| 7,439,201 B2 | 10/2008 | Drake et al. | | 501/15 |
| 7,545,094 B2 | 6/2009 | Choi et al. | | 313/504 |
| 7,564,185 B2 | 7/2009 | Song et al. | | 313/506 |
| 7,585,798 B2 | 9/2009 | Yoshida et al. | | 501/15 |
| 7,586,259 B2 | 9/2009 | Kwak | | 313/512 |
| 8,198,203 B2 | 6/2012 | Lamberson et al. | | 501/46 |
| 8,434,328 B2 | 5/2013 | Lamberson et al. | | 65/36 |
| 8,486,308 B2 * | 7/2013 | Ittel et al. | | 252/514 |
| 2002/0119884 A1 | 8/2002 | Buhrmaster et al. | | 501/15 |
| 2002/0128141 A1 | 9/2002 | Buhrmaster et al. | | 501/45 |
| 2003/0158030 A1 | 8/2003 | Yamamoto et al. | | 501/64 |
| 2004/0207314 A1 | 10/2004 | Aitken et al. | | 313/504 |
| 2005/0001545 A1 | 1/2005 | Aitken et al. | | 313/512 |
| 2007/0170846 A1 | 7/2007 | Choi et al. | | 313/504 |
| 2007/0170849 A1 | 7/2007 | Park | | 313/506 |
| 2007/0170850 A1 | 7/2007 | Choi et al. | | 313/506 |
| 2007/0170854 A1 | 7/2007 | Kwak | | 313/512 |
| 2007/0170857 A1 | 7/2007 | Choi et al. | | 313/512 |
| 2007/0170860 A1 | 7/2007 | Choi et al. | | 313/512 |
| 2007/0170861 A1 | 7/2007 | Lee et al. | | 313/512 |
| 2007/0171637 A1 | 7/2007 | Choi | | 362/227 |
| 2007/0176550 A1 | 8/2007 | Kwan | | 313/512 |
| 2007/0176551 A1 | 8/2007 | Kwak | | 313/512 |
| 2007/0176563 A1 | 8/2007 | Kim et al. | | 315/169.3 |
| 2007/0188079 A1 | 8/2007 | Song et al. | | 313/504 |
| 2007/0243991 A1 | 10/2007 | Brow et al. | | 501/45 |
| 2008/0048556 A1 | 2/2008 | Logunov et al. | | 313/504 |
| 2009/0009063 A1 | 1/2009 | Botelho et al. | | 313/504 |
| 2009/0069164 A1 | 3/2009 | Lamberson et al. | | 501/15 |
| 2009/0218932 A1 | 9/2009 | Wang | | 313/504 |
| 2009/0247385 A1 | 10/2009 | Ide | | 501/18 |
| 2010/0180934 A1 | 7/2010 | Naito et al. | | 136/252 |
| 2013/0305786 A1 | 11/2013 | Kikutani et al. | | 65/59.4 |

FOREIGN PATENT DOCUMENTS

| | | |
|---|---|---|
| JP | 10-074583 | 3/1998 |
| JP | 2001-319775 | 11/2001 |
| JP | 2003-187962 | 7/2003 |
| JP | 2012106891 | 6/2012 |
| WO | 9312049 | 6/1993 |
| WO | 0057499 | 9/2000 |
| WO | 0105205 | 1/2001 |
| WO | 0144865 | 6/2001 |
| WO | 0205361 | 1/2002 |
| WO | 0221557 | 3/2002 |
| WO | 03005774 | 1/2003 |
| WO | 03100832 | 12/2003 |
| WO | 2007067402 | 6/2007 |

OTHER PUBLICATIONS

Standard practice for making reference—glass-metal sandwich seal and testing for expansion Chraracteristics by Polarimetric methods.—Copyright—ASTM—2000. pp. 502-506.

Optical Absorption of the Transition Elements in Vitreous Silica—Peter C. Schultz, Research and Development lags, Corning, NY—Journal of the American Ceramic Society; Sep. 18, 1973 pp. 309-313.

From Information display: by Kimberly Allen, Director of Technology and Strategic Research at Stanford Resources; OLED Encapsulation, (2002).

Corning Incorporated Article—Display Technologies; Issued Aug. 2002; Corning 1737 AMLCD Glass Substrates Material Information.

Corning Incorporated Article—Display Technologies; Corning Eagle 2000 AMLCD Glass Substrates Material Information; Issued: Aug. 2002.

Optics Letters, vol. 23, No. 2/ Jan. 15, 1998; Laser-fabricated glass microlens arrays; M. Fritze, MB. Stern and PW Wyatt.

A Review and Recent developments of Photoelastic Techniques for the measurement of thermal expansion differentials using Glass seals; H.E. Hagy; Corning Incorporated.

Electrical Conductivity—Glasses; Hiroshi Hirashima, Kota Nishii, Tetsuro Yoshida; Dept. of Applied Chemistry: Keio University Japan; Dec. 20, 1982, 1983. By the Office of Naval Research.

* cited by examiner

ANTIMONY-FREE GLASS, ANTIMONY-FREE FRIT AND A GLASS PACKAGE THAT IS HERMETICALLY SEALED WITH THE FRIT

This application claims the benefit of priority under 35 U.S.C. §119(e) of U.S. Provisional Application Ser. No. 61/695,033 filed on Aug. 30, 2012, the content of which is incorporated herein by reference in its entirety.

TECHNICAL FIELD

The present disclosure relates to an antimony-free glass, a frit made therefrom, and hermetically sealed glass packages sealed with the frit that is suitable to protect devices, such as thin film devices, that are sensitive to the ambient environment. Some examples of such devices are organic emitting light diode (OLED) displays, sensors, photovoltaic and other optical devices. The embodiments described herein are demonstrated using OLED displays as a non-limiting example.

BACKGROUND

OLEDs have been the subject of a considerable amount of research in recent years because of their use and potential use in a wide variety of electroluminescent devices, and are now reaching commercialization. For instance, a single OLED can be used in a discrete light emitting device or an array of OLEDs can be used in lighting applications or flat-panel display applications (e.g., OLED displays). OLED displays are known as being very bright and having a good color contrast and wide viewing angle. However, OLED displays, and in particular the electrodes and organic layers located therein, are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment. Unfortunately, in the past it was very difficult to develop a sealing process to hermetically seal the OLED display.

Recently, glass-based frits have been used to seal glass substrate plates in a glass package that provides excellent hermeticity to the enclosed device. But many of these frits contain toxic elements, such as antimony, which pose environmental hazards. There is a need for a glass-based frit suitable for hermetically sealing glass packages, such as electronic devices (e.g. for display-type applications), having a low Tg that does not contain antimony.

SUMMARY

The present invention includes a hermetically sealed OLED display and method for manufacturing the hermetically sealed OLED display. Basically, the hermetically sealed OLED display is manufactured by providing a first glass substrate plate and a second glass substrate plate and depositing a frit onto the second glass substrate plate. An organic material, such as those used in the manufacture of an OLED may be deposited on the first substrate plate. An irradiation source (e.g., laser, infrared light) is then used to heat the frit which melts and forms a hermetic seal that connects the first glass substrate plate to the second glass substrate plate and also protects the OLEDs. The frit is an antimony-free glass that contains vanadium, and in some embodiments a coefficient of thermal expansion (CTE) lowering filler, such that when the irradiation source heats the frit, it softens and forms a bond. This enables the frit to melt and form the hermetic seal while avoiding thermal damage to the OLEDs. Vanadium phosphate frits, for example, have proven especially suitable for sealing glass packages of the type just described, and in particular antimony-containing vanadium phosphate frits. Such frits are very stable, exhibit high optical absorbance and have excellent mechanical and aqueous durability. Unfortunately, antimony is a toxic element, and efforts have been directed toward finding a replacement for antimony that does not detrimentally affect other beneficial attributes of the frit.

To that end, the excellent aqueous durability performance of Sb-vanadium phosphate frits was maintained without $Sb_2O_3$ by replacement of the antimony oxide by a combination of $Fe_2O_3+TiO_2$, along with a small addition of ZnO to maintain flow and glass transition temperature ($T_g$). The presence of $Fe_2O_3$ was found to have the greatest effect in improving durability. However, it raised $T_g$, thus degrading frit flow during sealing. In addition, frits with high $Fe_2O_3$ levels (equal to or greater than about 25 mole %) tended to be oxidatively unstable, with repeat samples fired to the same schedule (425° in $N_2$) exhibiting different colors (brown or black), with marked differences in the degree of flow. Although $TiO_2$ alone actually degraded aqueous durability to some extent, the combination of ($Fe_2O_3+TiO_2$) proved to be a good combination from the standpoint of obtaining laser-sealable frits. With the addition of $TeO_2$, both high aqueous durability and low $T_g$ (≤370° C.) can be attained.

Both lab bench tests exposing the glass to 90° C. deionized (DI) water as well as 85° C./85% relative humidity (RH) environmental chamber testing of laser-sealed samples indicate that frits based on a $TeO_2$—$Fe_2O_3$—$TiO_2$—$ZnO$—$V_2O_5$—$P_2O_5$ system are capable of forming a hermetic seal after laser-sealing. An unexpected result of the ($Fe_2O_3+TiO_2$) replacement of $Sb_2O_3$ combined with the at least partial substitution of $TeO_2$ for $P_2O_5$ was that a relatively large decrease in $T_g$ can be attained when compared to non-Te-containing frit glasses (370° C. to 349° C. for example).

Accordingly, in one embodiment an antimony-free glass is disclosed comprising:
$V_2O_5$ (≥30 and ≤60 mole %);
$P_2O_5$ (≥5 mole % and ≤20 mole %);
ZnO (0-10 mole %);
$Bi_2O_3$ (0-5 mole %);
$Fe_2O_3$ (≥10 mole % and ≤25 mole %);
$TiO_2$ (≥5 mole % and ≤20 mole %);
$TeO_2$ (≥5 mole % and ≤20 mole %); and
wherein $TiO_2+Fe_2O_3$ is in a range from 20 mole % to 35 mole %, for example in a range from about 20 mole % to about 30 mole %, in a range from about 25 mole % to about 35 mole % and in a range from about 25 mole % to about 30 mole %.

The antimony-free glass may have a $V_2O_5$ content ≥30 and ≤50 mole %.

The antimony-free glass may, in some embodiments, have a $V_2O_5$ content ≥30 and ≤40 mole % and a $P_2O_5$ content ≥5 mole % and ≤15 mole %.

The antimony-free glass may, in other embodiments, have a $V_2O_5$ content ≥35 mole % and ≤40 mole %, a $P_2O_5$ content ≥8 mole % and ≤10 mole %, and a ZnO content ≥3 mole % and ≤7 mole %.

The antimony-free glass can have, for example, the following composition:
$V_2O_5$ (40 mole %);
$P_2O_5$ (10 mole %);
ZnO (5 mole %);
$Fe_2O_3$ (15 mole %);
$TiO_2$ (15 mole %); and
$TeO_2$ (15 mole %).

In some embodiments the antimony-free glass has a $T_g \leq 350°$ C.

In some embodiments the antimony-free glass can comprise a glass frit. The glass frit may further comprise a CTE lowering filler, such as beta eucryptite or beta quartz.

In another embodiment a glass package is described comprising a first glass plate, a second glass plate and a frit that connects the first glass plate to the second glass plate and forms an hermetic seal therebetween, the frit including an antimony-free glass comprising:

$V_2O_5$ ($\geq 30$ and $\leq 60$ mole %);
$P_2O_5$ ($\geq 5$ mole % and $\leq 20$ mole %);
ZnO ($\geq 0$ and $\leq 10$ mole %);
$Bi_2O_3$ ($\geq 0$ and $\leq 5$ mole %);
$Fe_2O_3$ ($\geq 10$ mole % and $\leq 25$ mole %);
$TiO_2$ ($\geq 5$ mole % and $\leq 20$ mole %);
$TeO_2$ ($\geq 5$ mole % and $\leq 20$ mole %); and
wherein $TiO_2+Fe_2O_3$ is in a range from 20 mole % to 35 mole %, for example in a range from about 20 mole % to about 30 mole %, in a range from about 25 mole % to about 35 mole % and in a range from about 25 mole % to about 30 mole %.

The antimony-free glass of the frit may have a $V_2O_5$ content $\geq 30$ and $\leq 50$ mole %.

The antimony-free glass of the frit may, in some embodiments, have a $V_2O_5$ content $\geq 30$ and $\leq 40$ mole % and a $P_2O_5$ content $\geq 5$ mole % and $\leq 15$ mole %.

The antimony-free glass of the frit may, in other embodiments, have a $V_2O_5$ content $\geq 35$ mole % and $\leq 40$ mole %, a $P_2O_5$ content $\geq 8$ mole % and $\leq 10$ mole %, and a ZnO content $\geq 3$ mole % and $\leq 7$ mole %.

In some embodiments the antimony-free glass of the frit can have a $T_g \leq 350°$ C.

In some embodiments the frit may comprise a CTE lowering filler, such as beta eucryptite or beta quartz.

The glass package according may further comprise an organic material disposed between the first and second glass plates. For example, the organic material may comprise an organic light emitting diode. In some embodiments the glass package may comprise a flat display panel such as an organic light emitting diode (OLED) display panel. The OLED display panel may further comprise an OLED display device such as a television, computer display, telephone (e.g. cell phone) or any other device incorporating an optical display.

In still another embodiment a frit is disclosed comprising an antimony-free glass including:

$V_2O_5$ ($\geq 30$ and $\leq 60$ mole %);
$P_2O_5$ ($\geq 5$ mole % and $\leq 20$ mole %);
ZnO ($\geq 0$ and $\leq 10$ mole %);
$Bi_2O_3$ ($\geq 0$ and $\leq 5$ mole %);
$Fe_2O_3$ ($\geq 10$ mole % and $\leq 25$ mole %);
$TiO_2$ ($\geq 5$ mole % and $\leq 20$ mole %);
$TeO_2$ ($\geq 5$ mole % and $\leq 20$ mole %); and
wherein $TiO_2+Fe_2O_3$ is in a range from 20 mole % to 35 mole %, for example in a range from about 20 mole % to about 30 mole %, in a range from about 25 mole % to about 35 mole % and in a range from about 25 mole % to about 30 mole %.

The antimony-free glass may have a $V_2O_5$ content $\geq 30$ and $\leq 50$ mole %.

The antimony-free glass may, in some embodiments, have a $V_2O_5$ content $\geq 30$ and $\leq 40$ mole % and a $P_2O_5$ content $\geq 5$ mole % and $\leq 15$ mole %.

The antimony-free glass may, in other embodiments, have a $V_2O_5$ content $\geq 35$ mole % and $\leq 40$ mole %, a $P_2O_5$ content $\geq 8$ mole % and $\leq 10$ mole %, and a ZnO content $\geq 3$ mole % and $\leq 7$ mole %.

The frit may comprise a CTE-lowering filler such as beta eucryptite or beta quartz.

In still another embodiment, a method of making a glass package is disclosed comprising depositing a frit onto a first glass substrate; positioning a second glass substrate adjacent to the first glass substrate so that the frit is disposed between the first and second glass substrates; irradiating the frit with radiant energy, for example from a laser, so that the frit is heated and melts and then cools so that the frit forms a hermetic seal between the first and second substrates; and wherein the frit comprises an antimony-free glass comprising:

$V_2O_5$ ($\geq 30$ and $\leq 60$ mole %);
$P_2O_5$ ($\geq 5$ mole % and $\leq 20$ mole %);
ZnO (0-10 mole %);
$Bi_2O_3$ (0-5 mole %);
$Fe_2O_3$ ($\geq 10$ mole % and $\leq 25$ mole %);
$TiO_2$ ($\geq 5$ mole % and $\leq 20$ mole %);
$TeO_2$ ($\geq 5$ mole % and $\leq 20$ mole %); and
wherein $TiO_2+Fe_2O_3$ is in a range from 20 mole % to 35 mole %, for example in a range from about 20 mole % to about 30 mole %, in a range from about 25 mole % to about 35 mole % and in a range from about 25 mole % to about 30 mole %.

The antimony-free glass may have a $V_2O_5$ content $\geq 30$ and $\leq 50$ mole %.

The antimony-free glass may, in some embodiments, have a $V_2O_5$ content $\geq 30$ and $\leq 40$ mole % and a $P_2O_5$ content $\geq 5$ mole % and $\leq 15$ mole %.

The antimony-free glass may, in other embodiments, have a $V_2O_5$ content $\geq 35$ mole % and $\leq 40$ mole %, $P_2O_5$ content $\geq 8$ mole % and $\leq 10$ mole %, and a ZnO content $\geq 3$ mole % and $\leq 7$ mole %.

The antimony-free glass can have, for example, the following composition:

$V_2O_5$ (40 mole %);
$P_2O_5$ (10 mole %);
ZnO (5 mole %);
$Fe_2O_3$ (15 mole %);
$TiO_2$ (15 mole %); and
$TeO_2$ (15 mole %).

In some embodiments the antimony-free glass of the frit has a $T_g \leq 350°$ C.

In some embodiments the frit may further comprise a CTE lowering filler, such as beta eucryptite or beta quartz.

The present disclosure will be understood more easily and other objects, characteristics, details and advantages thereof will become more clearly apparent in the course of the following explanatory description, which is given, without in any way implying a limitation, with reference to the attached Figures. It is intended that all such additional systems, methods, features and advantages be included within this description and be protected by the accompanying claims.

DETAILED DESCRIPTION

Figure 1:
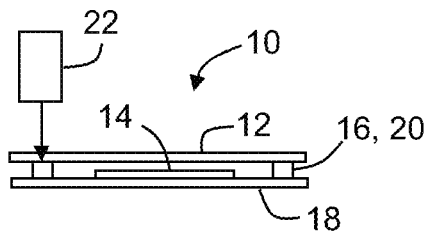
FIG. 1 is a cross sectional illustration of the sealing of an exemplary OLED device using a frit according to embodiments of the present disclosure.

In the following detailed description, for purposes of explanation and not limitation, example embodiments disclosing specific details are set forth to provide a thorough understanding of the present disclosure. However, it will be apparent to one having ordinary skill in the art, having had the benefit of the present disclosure, that the embodiment described herein may be practiced in other embodiments that depart from the specific details disclosed herein. Moreover, descriptions of well-known devices, methods and materials may be omitted so as not to obscure the description of the embodiments described. Finally, wherever applicable, like reference numerals refer to like elements.

FIG. 1 depicts a cross-sectional side view illustrating the sealing of the basic components of a hermetically sealed OLED display 10. OLED display 10 includes a multilayer sandwich of a first glass substrate plate 12, one or more OLEDs 14, frit 16 and a second glass substrate plate 18. OLED display 10 comprises hermetic seal 20 formed from frit 16 that protects OLEDs 14 located between the first glass substrate plate 12 and the second glass substrate plate 18. Hermetic seal 20 is typically located around the perimeter of OLED display 10. OLEDs 14 are located within a perimeter of hermetic seal 20. The composition of frit 16, and more particularly the composition of the glass of frit 16, as well as how the hermetic seal 20 is formed from frit 16 is described in greater detail below.

In one embodiment, first and second glass substrate plates 12 and 18 are transparent glass plates. Frit 16 is deposited along the edges of second glass substrate plate 18. For instance, frit 16 can be placed approximately 1 mm away from the free edges of the second glass substrate plate 18. In the preferred embodiment, frit 16 is a low temperature antimony-free glass frit containing vanadium to enhance the optical absorbance of the frit. Frit 16 may also include a filler material, such a beta eucryptite or beta quartz, that lowers the coefficient of thermal expansion (CTE) of the frit so that it matches or substantially matches the CTEs of the two glass substrate plates 12 and 18.

OLEDs 14 and other circuitry are deposited onto second glass substrate plate 18. The typical OLED 14 includes an anode electrode, one or more organic layers and a cathode electrode. However, it should be readily appreciated that other environmentally sensitive components can be deposited onto second glass substrate plate 18.

Optionally, frit 16 can be pre-sintered to first glass substrate plate 12 prior to sealing glass substrates 12 and 18 together. To accomplish this, first glass substrate plate 12 comprising frit 16 deposited thereon is heated in a furnace or oven so that it becomes attached to the first glass substrate plate 12.

Next, first and second glass substrate plates 12 and 18 are brought together with frit 16 and one or more OLEDs positioned between them, and frit 16 is irradiated by irradiation source 22 (e.g. a laser or an infrared lamp) so that the frit 16 forms hermetic seal 20 that connects and bonds the first glass substrate plate 12 to second glass substrate plate 18. Hermetic seal 20 also protects OLEDs 14 by preventing oxygen and moisture in the ambient environment from entering into the OLED display 10.

It should be readily appreciated that the irradiating wavelength should be within the band of high absorption in the particular frit 16. For instance, Ytterbium (900 nm<$\lambda$<1200 nm), Nd:YAG ($\lambda$=1064 nm), Nd:YALO ($\lambda$=1.08 µm), and erbium ($\lambda \approx$1.5 µm) CW lasers can be used depending on the optical properties of the particular frit 16 and glass substrate plates 12 and 18.

It should be noted that most traditional low temperature sealing frits are PbO-based, because PbO frits have good flow, and adhesion properties. However, certain antimony-free frits disclosed herein not only have a lower CTE than PbO-based frits, but also possess better aqueous durability, as well as being comparable to the traditional Pb-based frits with respect to adhesion.

In addition, although the role played by $P_2O_5$ in a successful sealing frit is important, since it permits stable glasses to be formed, from a laser-sealing and post-seal performance standpoint the effect of $Sb_2O_3$ and $V_2O_5$ should not be ignored. $V_2O_5$-based frits and glasses have notoriously poor aqueous durability. In previous testing, seals made with Sb-free, Zn-based vanadium-phosphate fits could only survive a relatively benign environment of 60° C./40% relative humidity (RH), while seals made from mixed Sb—Zn vanadium phosphate fits survived 60° C./85% RH before failing. Conversely, only seals made with Sb-vanadium-phosphate frits survived 85° C./85% RH exposure. However, despite the role that $Sb_2O_3$ plays in improving aqueous durability, feedback from potential customers consistently raises concern about its presence, noting that antimony is a toxic element. Thus, recent emphasis has been placed on development of a glass suitable for use in a sealing frit that is also environmentally friendly.

Early work on $Sb_2O_3$-free compositions began by first expressing a basic OLED device sealing frit composition as a three component system comprising oxides of antimony, vanadium and phosphorous. These compositions were then simplified to a two component $Sb_2O_3$-free system, and additional components identified based on their effect on aqueous durability, flow, glass transition temperature ($T_g$), and laser-sealability. Both aqueous durability, laser-sealability, and flow of any candidate frit compositions needed to be comparable to $Sb_2O_3$-containing control samples, with the criterion that $T_g$ had to be equal to or less than 400° C. (Frits with $T_g$>400° are unlikely to flow sufficiently during the presintering step for OLED frits to be handleable in subsequent processing.) Potential substitutes for antimony oxide ($Sb_2O_3$) were: $WO_3$, $MoO_3$, $TeO_2$, $Bi_2O_3$, $Fe_2O_3$, and $TiO_2$. ZnO was also investigated, although in view of the poor durability results obtained for a ZnO—$V_2O_5$—$P_2O_5$ frit, it was considered only as a minor component (0-10%) to lower $T_g$ and maintain flow. The various oxides selected were chosen on the basis that they formed stable binary glasses with $V_2O_5$.

Each of the compositions was melted, poured as a glass patty, then ball-milled to form fine-particle frits (typically with a $d_{50}$ in a range from about 3 to about 5 µm). All compositions are expressed in mole percent (mole %), and all temperatures in degrees centigrade (° C.). A key bench test to screen the different compositions was to prepare and fire flow buttons of the various fits, and then to assess their aqueous durability. The flow buttons were fired in a nitrogen ($N_2$) atmosphere to a temperature in a range from about 400° C. to about 450° C. (depending upon $T_g$ and crystallization tendency). After firing, the flow buttons were immersed in 90° C. deionized water for 48 hours (hr) to assess their aqueous durability. Control samples of the OLED frit (either as the D1 base glass—see Table 1, or as a 70:30 blend of the D1 base glass with a β-eucryptite filler) were also included in each evaluation. Of the potential replacements for $Sb_2O_3$ that were investigated (see above), only $TiO_2$ and $Fe_2O_3$ appeared promising.

Listed in Tables 1 and 2 are results for a 50 mole % $V_2O_5$—30 mole % $P_2O_5$ composition series with $WO_3$, $MoO_3$, $WO_3$+ZnO, $Bi_2O_3$, and $TeO_2$ as the third component. Also shown are data on the standard $Sb_2O_3$-containing OLED base glass, D1, as a comparison standard. All compositions (given in mole %) were evaluated for quality of glass formed from the pour, glass transition temperature ($T_g$) by differential scanning calorimetry (DSC), flow and sinterability as a 3 μm powder hand-pressed into a pellet ("flow button") and fired at 400° C. for 1 hour in $N_2$, and aqueous durability (as gauged by the color of the supernatant for a fired flow button sample—the darker the color, the less durable the sample) in the bench aqueous durability test described above. Note that none of the potential $Sb_2O_3$ replacements listed in Tables 1 and 2 produced the acceptable level of glass quality, $T_g$, flow, and aqueous durability exhibited by the $Sb_2O_3$-containing control (as judged by the appearance of the supernatant after exposure for 48 hours to deionized $H_2O$ at a temperature of 90° C.).

TABLE 1

|  | D1 | D2 | D3 |
|---|---|---|---|
| Composition (molar basis) | $Sb_2O_3$, 22.9<br>$V_2O_5$, 46.4<br>$P_2O_5$, 26.3<br>$Fe_2O_3$, 2.4<br>$Al_2O_3$, 1.0<br>$TiO_2$, 1.0 | $V_2O_5$, 50<br>$P_2O_5$, 30<br>$WO_3$, 20 | $V_2O_5$, 50<br>$P_2O_5$, 30<br>$MoO_3$, 20 |
| Glass quality at pour | Excellent | Fluid, good quality | Very fluid, good quality |
| $T_g$ | 355° C. | 349° C. | 315° C. |
| Flow (400° C.-1 hr, $N_2$) | Very good flow and sinterability | Semi-glossy, well-sintered, no flow | Glossy and black with some slump |
| Aqueous durability, appearance of supernatant (48 hrs, 90° C. D.I. $H_2O$) | V. slightly tinted | Black | Black |

TABLE 2

|  | D4 | D5 | D6 |
|---|---|---|---|
| Composition (molar basis) | $V_2O_5$, 50<br>$P_2O_5$, 30<br>$WO_3$, 10<br>ZnO, 10 | $V_2O_5$, 50<br>$P_2O_5$, 30<br>$Bi_2O_3$, 20 | $V_2O_5$, 50<br>$P_2O_5$, 30<br>$TeO_2$, 20 |
| Glass quality at pour | Good glass, fluid, poured well | Crystallized after pouring | More viscous pour, glass looked good |
| $T_g$ | 323° C. | Not eval. | 329° C. |
| Flow (400° C.-1 hr, $N_2$) | Poor flow | Not eval. | Semi-glossy black, no slump |
| Aqueous durability | Black | Not eval. | Black |

More positive results for $Sb_2O_3$-free vanadium phosphate frits were obtained by $Fe_2O_3$ and/or $TiO_2$ replacement of $Sb_2O_3$ (see Tables 3 and 4 below). All compositions are expressed in mole %. Several combinations of $Fe_2O_3$+$TiO_2$ produced good glasses at pouring. High $TiO_2$ glasses (i.e., ≥25%), such as D8, had acceptable $T_g$ and flow properties, but also exhibited poor aqueous durability. Higher $Fe_2O_3$ glasses (i.e., ≥25 or 30%), such as D7 and D11, tended to produce poor glasses at pour, as evidenced by substantial surface devitrification. The relatively poor stability of these glasses (as indicated by the high amount of surface devitrification formed in the patty at pouring) resulted in poor flow as frits. They also tended to be unstable with respect to oxidation state, with a fired flow button from the same lot of powder alternately appearing either black (reduced) or red (oxidized) after the same firing conditions. Also included in Table 4 is D14, a glass with relatively high $Fe_2O_3$ and $TiO_2$ levels, but with 10 mole % ZnO to lower the expected increase in $T_g$ from the $Fe_2O_3$. Note that a second approach to accommodating high $Fe_2O_3$ levels is increasing the $V_2O_5$ content. But as may be seen for D9 and D10, aqueous durability was compromised at higher $V_2O_5$ content.

TABLE 3

|  | D7 | D8 | D9 | D10 |
|---|---|---|---|---|
| Composition (molar basis) | $V_2O_5$, 45<br>$P_2O_5$, 30<br>$Fe_2O_3$, 25 | $V_2O_5$, 45<br>$P_2O_5$, 30<br>$TiO_2$, 25 | $V_2O_5$, 50<br>$P_2O_5$, 30<br>$TiO_2$, 15<br>$Fe_2O_3$, 5 | $V_2O_5$, 50<br>$P_2O_5$, 30<br>$TiO_2$, 10<br>$Fe_2O_3$, 10 |
| Glass quality at pour | Substantial surface devit | Poured nicely | Poured nicely | Poured nicely |
| $T_g$ | 353° C. | 345° C. | 323° C. | 322° C. |
| Flow (400° C., 1 hr, $N_2$) | Poorly sintered | Semi-glossy black, no slump | Sintered, some flow | Sintered, slight flow |
| Aqueous durability, appearance of supernatant (48 hrs, 90° C. D.I. $H_2O$) | Not tested | Black | Med. green | Med. green |

TABLE 4

|  | D11 | D12 | D13 | D14 |
|---|---|---|---|---|
| Composition (molar basis) | $V_2O_5$, 42<br>$P_2O_5$, 28<br>$TiO_2$, 0<br>$Fe_2O_3$, 30 | $V_2O_5$, 40<br>$P_2O_5$, 25<br>$TiO_2$, 17.5<br>$Fe_2O_3$, 17.5 | $V_2O_5$, 45<br>$P_2O_5$, 25<br>$TiO_2$, 0<br>$Fe_2O_3$, 30 | $V_2O_5$, 40<br>$P_2O_5$, 20<br>$TiO_2$, 15<br>$Fe_2O_3$, 15<br>ZnO, 10 |
| Glass quality at pour | Viscous, surface devit | Good glass, no devit | Viscous, surface devit | Good glass, no devit |
| $T_g$ | 371° C. | 364° C. | 376° C. | 360° C. |
| Flow (400° C., 1 hr, $N_2$) | Poor - powdery and unconsolidated | Poor - powdery | Poor | Semi-glossy black, sintered, no slump |
| Aqueous durability | Not eval. | Not eval. | Not eval. | Lt. brown |

It should also be noted that although the test samples of Tables 3 and 4 having $P_2O_5$ levels equal to or greater than 25 mole % performed poorly, it is anticipated that $P_2O_5$ levels less than 25 mole % can be successfully employed. Table 5 summarizes the results of a second set of $Fe_2O_3$ and $TiO_2$ melts at 10% ZnO. All compositions are expressed in mole %. As for the initial series, some combination of $Fe_2O_3$ and $TiO_2$ is preferred, since $Fe_2O_3$ contributes excellent aqueous durability (but at the cost of high $T_g$ and reduced frit sintering at 400° C.), and $TiO_2$ results in lower $T_g$ and improved flow (but at the cost of aqueous durability).

TABLE 5

|  | D15 | D16 | D17 | D18 | D19 |
|---|---|---|---|---|---|
| Composition (molar basis) | $V_2O_5$, 50<br>$P_2O_5$, 20<br>ZnO, 10<br>$Fe_2O_3$, 0<br>$TiO_2$, 20 | $V_2O_5$, 50<br>$P_2O_5$, 20<br>ZnO, 10<br>$Fe_2O_3$, 5<br>$TiO_2$, 15 | $V_2O_5$, 50<br>$P_2O_5$, 20<br>ZnO, 10<br>$Fe_2O_3$, 10<br>$TiO_2$, 10 | $V_2O_5$, 50<br>$P_2O_5$, 20<br>ZnO, 10<br>$Fe_2O_3$, 15<br>$TiO_2$, 5 | $V_2O_5$, 50<br>$P_2O_5$, 20<br>ZnO, 10<br>$Fe_2O_3$, 20<br>$TiO_2$, 0 |
| Glass quality at pour | Poured nicely | Poured nicely | Poured nicely | Poured nicely | Poured nicely |
| $T_g$ | 297° C. | 310° C. | 322° C. | 333° C. | 348° C. |
| Flow (400°-1 hr, $N_2$) | Well-sintered, good flow | Well-sintered, good flow | Sintered, slight flow | Sintered, some flow | Sintered, little flow |
| Aqueous durability | Dark black | Dark black | Dark black | Clear | Clear |

An additional series of melts were made at higher levels of $Fe_2O_3+TiO_2$ with ZnO maintained at 5 mole % (see Tables 6 and 7 below). All compositions are expressed in mole %. Note that to accommodate the higher $T_g$ of the high $Fe_2O_3$ glasses, flow was evaluated at 425° C., rather than the 400° C. previously used. All amounts are in mole %.

TABLE 6

|  | D20 | D21 | D22 | D23 |
|---|---|---|---|---|
| Composition (molar basis) | $V_2O_5$, 40<br>$P_2O_5$, 20<br>ZnO, 5<br>$Fe_2O_3$, 35<br>$TiO_2$, 0 | $V_2O_5$, 40<br>$P_2O_5$, 20<br>ZnO, 5<br>$Fe_2O_3$, 30<br>$TiO_2$, 5 | $V_2O_5$, 40<br>$P_2O_5$, 20<br>ZnO, 5<br>$Fe_2O_3$, 25<br>$TiO_2$, 10 | $V_2O_5$, 40<br>$P_2O_5$, 20<br>ZnO, 5<br>$Fe_2O_3$, 20<br>$TiO_2$, 15 |
| Glass quality at pour | Substantial surface + bulk devit | Surface devit | Surface devit | Good glass, no devit |
| $T_g$ | 416° C. | 407° C. | 400° C. | 389° C. |
| Flow (425°-1 hr, $N_2$) | Not sinterable at 425° C. | Not sinterable at 425° C. | Not sinterable at 425° C. | Sintered, no flow |
| Aq. durability | Not tested | Not tested | Not tested | Clear |

TABLE 7

|  | D24 | D25 | D26 | D27 | D28 |
|---|---|---|---|---|---|
| Composition (molar basis) | $V_2O_5$, 40<br>$P_2O_5$, 20<br>ZnO, 5<br>$Fe_2O_3$, 17.5<br>$TiO_2$, 17.5 | $V_2O_5$, 40<br>$P_2O_5$, 20<br>ZnO, 5<br>$Fe_2O_3$, 15<br>$TiO_2$, 20 | $V_2O_5$, 40<br>$P_2O_5$, 20<br>ZnO, 5<br>$Fe_2O_3$, 10<br>$TiO_2$, 25 | $V_2O_5$, 40<br>$P_2O_5$, 20<br>ZnO, 5<br>$Fe_2O_3$, 5<br>$TiO_2$, 30 | $V_2O_5$, 40<br>$P_2O_5$, 20<br>ZnO, 5<br>$Fe_2O_3$, 0<br>$TiO_2$, 35 |
| Glass quality at pour | Good glass, no devit | Good glass, no devit | Good glass, no devit | Good glass, no devit | Good glass, no devit |
| $T_g$ | 379° C. | 367° C. | 351° C. | 333° C. | 324° C. |
| Flow (425° C.-1 hr, $N_2$) | Sintered, slight flow | Sintered slight flow | Sintered, mod. flow | Sintered, mod. flow | Sintered, good flow |
| Aq. durability | Clear with v. slight tint | Clear | Med. green | Med. green (residue) | Med. green (residue) |

As seen in previous results from Tables 1, 2 and 3, 4, $Fe_2O_3$ levels not much higher than 20 mole % (e.g. about 25 mole %) resulted in fits with high $T_g$, poor stability, and unacceptable flow during 400-425° C. sintering. Similarly, $TiO_2$ not much higher than 20 mole % (e.g. about 25 mole %), resulted in frits with acceptable $T_g$, flow, and stability, but with unacceptable aqueous durability. Frits with $Fe_2O_3$ levels ranging from about 10 to less than 25 mole %, and with $TiO_2$ levels from about 15 to less than 25 mole % (at 5-10 mole % ZnO) combine excellent aqueous durability with acceptable flow, $T_g$, and glass stability.

Figure 2:
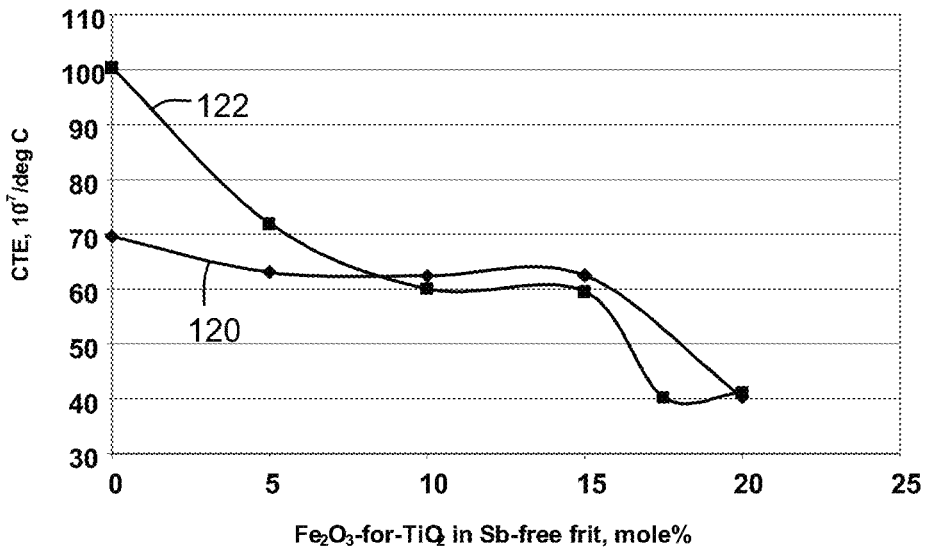
FIG. 2 is a plot of coefficient of thermal expansion (CTE) as a function of the substitution of $Fe_2O_3$ for $TiO_2$ in an Sb-free frit according to embodiments of the present disclosure in mole % where $Fe_2O_3+TiO_2$ is between 20 mole % and 35 mole %.

The aqueous durability of the ($Fe_2O_3+TiO_2+ZnO$) $Sb_2O_3$-free $V_2O_5$—$P_2O_5$ fits were found to be comparable to or slightly superior to the $Sb_2O_3$-containing standard composition. An unexpected result of the $Sb_2O_3$-free work is that the coefficient of thermal expansion (CTE) becomes dramatically lower for the ($Fe_2O_3+TiO_2+ZnO$) frits at higher $Fe_2O_3$ levels. Shown in FIG. 2 are CTE data for sintered frits whose composition is listed in Tables 3, 4 and 5. Data are presented for all sinterable frits in the 20 mole % ($Fe_2O_3+TiO_2$) series of Table 3, 4, (curve 120) and for the 35 mole % ($Fe_2O_3+TiO_2$) series of Table 5 (curve 122). CTE data for sintered frit bars are plotted as a function of $Fe_2O_3$ level in each series up to 20 mole % $Fe_2O_3$, the apparent upper limit to achieving frits with good sinterability and oxidative stability. Note that CTE values are highest at 0 mole % $Fe_2O_3$/maximum $TiO_2$ (20 and 35 mole %, respectively), become essentially constant with increasing $Fe_2O_3$ level at $60-65\times10^{-7}$/° C., and then decrease substantially at $Fe_2O_3>15$ mole % (5 mole % and ≤20 mole % $TiO_2$, respectively), reaching a value of approximately $40\times10^{-7}$/° C. at 17.5-20 mole % $Fe_2O_3$. By comparison, the CTE of the $Sb_2O_3$-containing base frit is approximately $70-80\times10^{-7}$/° C.

Figure 3:
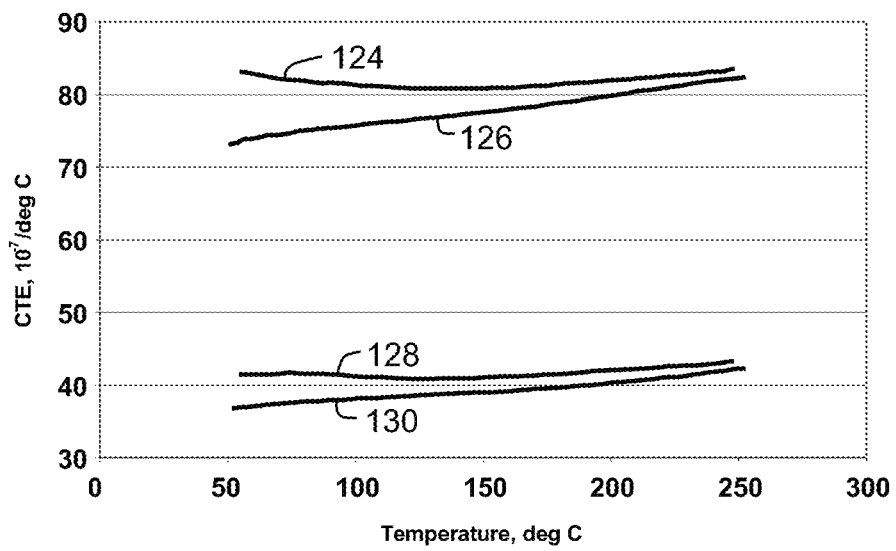
FIG. 3 is a plot comparing CTE as a function of temperature for an Sb-free frit according to embodiments of the present invention and an Sb-containing frit under both heating and cooling conditions.

A more direct comparison of CTE between the $Sb_2O_3$-containing and $Sb_2O_3$-free fits is shown in FIG. 3 where CTE curves are plotted for D1 under both heating and cooling conditions (curves 124 and 126, respectively) and D29 (a remelt of D24, Table 7) also under both heating and cooling conditions (curves 128 and 130, respectively). With a CTE value of approximately $40 \times 10^{-7}/°$ C. for a frit without filler, it is possible, with the addition of fillers such as β-eucryptite or beta quartz, to lower the CTE value of this frit close to that of fused silica.

The lab-scale aqueous durability results for Sb-free frits were corroborated in a large scale sealing trial involving 85° C./85% RH exposure of laser-sealed samples. Shown in Table 8 are results of the trial and comparison between the standard OLED frit (D1, Table 1; used as a 70:30 blend with low CTE filler β-eucryptite), and an Sb-free frit (D29, a remelt of D24, Table 7; used as an 80:20 wt. blend with low CTE filler β-quartz). Each frit blend was made into a paste, dispensed on several sheets of EAGLE$^{XG}$ display glass, wherein one of the glass sheets included a thin film of calcium deposited thereon as an indicator of hermeticity, presintered (Sb-containing standard, 325° C. for 2 hours in air followed by heating at 400° C. for 1 hour in $N_2$; Sb-free, 325° C. for 2 hours in air followed by heating at 425° C. for 1 hour in $N_2$), sealed to sheets of Corning® EAGLE$^{XG}$, placed in an 85° C./85% relative humidity environmental chamber, and then examined periodically for evidence of seal leakage and Ca metal breakdown. In total, there were 3 sheets of the Sb-containing control composition and 7 sheets of the antimony-free composition included in the study, with 9 sealed arrays of calcium (Ca) metal tabs per sheet.

As may be seen in Table 8, several arrays failed either immediately after sealing or within 100 hours of placing them in 85° C./85% RH chamber for both the Sb-control and the Sb-free frits, where failure is indicated by visible oxidation of the calcium tabs; these failures were related, most likely, to gross defects such as contamination present at random for each frit. However, after 96 hours, no additional failures were observed for either the Sb-control or the Sb-free frit seals.

TABLE 8

|  | Laser-sealed | At start of 85° C./ 85% RH | After 96 hrs of 85° C./ 85% RH | After 1056 hrs of 85° C./ 85% RH |
|---|---|---|---|---|
|  | No. of good cells | | | |
| Standard Sb-frit blend (70:30, D1:β-eucryptite) | 27 (3 sheets) | 25 | 24 | 24 |
| Sb-free frit blend (80:20, D29:β-quartz) | 63 (7 sheets) | 61 | 57 | 57 |

The excellent aqueous durability performance of Sb-vanadium phosphate frits was maintained without $Sb_2O_3$ by replacing the antimony oxide with a combination of $Fe_2O_3$+$TiO_2$, along with a small addition of ZnO to maintain flow and glass transition temperature ($T_g$). The presence of $Fe_2O_3$ was found to have the greatest effect in improving durability. However, in large amounts it raised $T_g$, thus degrading frit flow during sealing. In addition, frits with high $Fe_2O_3$ levels (equal to or greater than about 25 mole %) tended to be oxidatively unstable, with repeat samples fired to the same schedule (425° C. in $N_2$) exhibiting different colors (brown or black), with marked differences in the degree of flow. Although $TiO_2$ actually degraded aqueous durability to some extent when added by itself, the combination of $Fe_2O_3$+$TiO_2$ appeared to be an ideal combination from the standpoint of obtaining laser-sealable fits with both high aqueous durability and low $T_g$ ($\leq 400°$ C.).

Both lab bench tests in 90° C. distilled water as well as 85° C./85% relative humidity (RH) environmental chamber testing of laser-sealed samples indicate that frits based on the $Fe_2O_3$—$TiO_2$—ZnO—$V_2O_5$—$P_2O_5$ system are capable of forming a hermetic seal after laser-sealing that will withstand high humidity conditions for extended times ($\geq 1000$ hours). An unexpected result of the $Fe_2O_3$+$TiO_2$ replacement of $Sb_2O_3$ was that the CTE of the Sb-free frit without fillers decreased by approximately half, from $70-80 \times 10^{-7}/°$ C. to $35-45 \times 10^{-7}/°$ C., with only a minor increase in $T_g$ (from 355° C. to 370° C.). Frits with CTE values near $40 \times 10^{-7}/°$ C. have the potential, with the addition of $T_g$-lowering fillers such as β-eucryptite or beta quartz, of being able to seal fused silica and other low CTE substrates such as Kovar™.

As noted above, although the presence of $Fe_2O_3$ produced favorable CTEs, $Fe_2O_3$ does, however, act to increase $T_g$. Although ZnO and $TiO_2$ counteract to some extent the role of $Fe_2O_3$ in raising $T_g$, they also tend to lessen resistance to aqueous attack.

In attempting to obtain an Sb-free composition with a $T_g$ comparable to or lower than the Sb-containing control D1, the role of $P_2O_5$ was further investigated. As noted earlier, $P_2O_5$ (a glass former) serves to increase the glass stability of the frit, since, when present at low levels, the vanadium-antimony glass is prone to rapid crystallization. Accordingly, D24 was used as a new starting point, and the $P_2O_5$ at least partially replaced with a different low $T_g$ glass former such as $TeO_2$ or $Bi_2O_3$. As described earlier, the use of Te as a substitute for antimony (e.g. sample D6) tended not to result in suitable glass for a frit. However, when combined with antimony replacements $Fe_2O_3$ and $TiO_2$, the results were unexpectedly favorable for Tg. Listed below in Table 9 are two examples of an Sb-free frit, D29 and D30, employing partial $TeO_2$ or $Bi_2O_3$ replacement of $P_2O_5$. All compositions are expressed in mole %. The batches for each sample were melted in uncovered silica crucibles, and were held for 1 hour at 1000° C. in air, taken out, mixed in a second crucible, and then poured onto a metal plate.

TABLE 9

|  | D29 (10% $TeO_2$ for $P_2O_5$) (mole %) | D30 (10% $Bi_2O_3$ for $P_2O_5$) |
|---|---|---|
| $V_2O_5$ | 40.0 | 40.0 |
| $P_2O_5$ | 10.0 | 10.0 |
| $TeO_2$ | 10.0 | 0 |
| $Bi_2O_3$ | 0 | 10.0 |
| $Fe_2O_3$ | 17.5 | 17.5 |
| $TiO_2$ | 17.5 | 17.5 |
| ZnO | 5.0 | 5.0 |
| Appearance of poured patty | Vitreous, with minor cherty texture | Very crystalline |
| DSC | $T_g = 349°$ C. $T_x$ (onset) = 428° C. | |

As shown in Table 9, partial substitution of $P_2O_5$ by $TeO_2$ resulted in a good quality glass that had a 30° C. drop in $T_g$ compared to the Sb-free/$P_2O_5$ sample D24, whereas similar replacement with $Bi_2O_3$ failed to produce an acceptable glass. The nearly 80° C. interval between $T_g$ and crystallization onset ($T_x$) for D29 suggests a $TeO_2$-containing glass, such as the glass of sample D29, as a suitable, well-behaved glass for frit. It is believed, however, that lesser amounts of $Bi_2O_3$ than the 10 mole % present in sample D30, such as between 0 and 9 mole %, between 0 and 7 mole %, or between 0 and 5 mole %, will be suitable.

Additional $TeO_2$-for-$P_2O_5$ substitutions were made using D24 as a starting point to determine the effect of the $P_2O_5$ replacement on selected properties of the resultant frit, and the results are shown below in Table 10. All compositions are expressed in mole %.

TABLE 10

|  | D31 | D32 | D33 | D34 | D35 | D36 | D37 |
|---|---|---|---|---|---|---|---|
| $V_2O_5$ | 40.0 | 40.0 | 35.0 | 40.0 | 35.0 | 35.0 | 35.0 |
| $P_2O_5$ | 15.0 | 10.0 | 15.0 | 15.0 | 20.0 | 10.0 | 15.0 |
| $TeO_2$ | 5.0 | 10.0 | 10.0 | 10.0 | 10.0 | 10.0 | 15.0 |
| $Fe_2O_3$ | 17.5 | 17.5 | 17.5 | 15.0 | 15.0 | 20.0 | 15.0 |
| $TiO_2$ | 17.5 | 17.5 | 17.5 | 15.0 | 15.0 | 20.0 | 15.0 |
| ZnO | 5.0 | 5.0 | 5.0 | 5.0 | 5.0 | 5.0 | 5.0 |
| Appearance of poured patty | Vitreous, with minor cherty texture | Vitreous, with minor cherty texture, slht. surface devit | Vitreous, with minor cherty texture | Vitreous, with very. minor cherty texture | Vitreous | Fine scale devit throughout sample | Vitreous |
| DSC (very. coarse powder), |  |  |  |  |  |  |  |
| $T_g$ | 361° C. | 347° C. | 368° C. | 359° C. | 366° C. | 367° C. | 363° C. |
| $T_x$ (onset) | 473° C. | 442° C. | 495° C. | 498° C. | 534° C. | 454° C. | 515° C. |
| Δ | 112° C. | 95° C. | 127° C. | 139° C. | 168° C. | 77° C. | 152° C. |

In comparison to D24, each of the glasses with $TeO_2$-for-$P_2O_5$ substitution in Table 10 showed a decrease in $T_g$. The glasses with the best stability (i.e., least amount of noticeable devitrification, and highest Δ, where delta, Δ, is the temperature difference between $T_g$ and $T_x$) such as D34, D35 and D37, contained 65% glass former (i.e., $V_2O_5+P_2O_5+TeO_2$), while the glass exhibiting the poorest glass stability (D36) contained a decreased amount of total glass forming, 55%.

Additional melts were made to further define the effect $TeO_2$-for-$P_2O_5$ substitution has on glass stability and frit properties, with emphasis given to determining the effect that total glass former and $P_2O_5$ content have on glass stability and $T_g$. Results are shown in Table 11 below. All compositions are expressed in mole %.

TABLE 11

|  | D38 | D39 | D40 | D41 | D42 | D43 |
|---|---|---|---|---|---|---|
| $V_2O_5$ | 40 | 40 | 40 | 40 | 40 | 35 |
| $P_2O_5$ | 10 | 0 | 10 | 0 | 10 | 10 |
| $TeO_2$ | 10 | 20 | 15 | 25 | 25 | 25 |
| $Fe_2O_3$ | 17.5 | 17.5 | 15 | 15 | 15 | 15 |
| $TiO_2$ | 17.5 | 17.5 | 15 | 15 | 5 | 10 |
| ZnO | 5 | 5 | 5 | 5 | 5 | 5 |
| Total glass former | 60% | 60% | 65% | 65% | 75% | 70% |
| Appearance of poured patty | Vitreous, with minor cherty texture | Major devit | Vitreous | Major devit |  |  |
| DSC (3 μm powder), |  |  |  |  |  |  |
| $T_g$ | 349° C. |  | 338° C. |  |  |  |
| $T_x$ (onset) | 425° C. |  | 442° C. |  |  |  |
| Δ | 76° C. |  | 104° C. |  |  |  |
| Aqueous durability (appearance of supernatant after 48 hr in 90° D.I. $H_2O$) | Very slightly discolored |  | slightly discolored |  |  |  |

Only the D38 through D41 glasses from Table 11 were melted. Of the D38 through 41 glasses, all had total glass former levels ≥60% ($V_2O_5+P_2O_5+TeO_2$). However, even at these high levels of glass former, a minimum amount of $P_2O_5$ was needed to achieve good glass stability (compare, for example, D40 vs. D39 and D41). The results illustrate the effective role $P_2O_5$ plays in stabilizing vanadium glasses with $V_2O_5$ content in the range from about 30 to about 50%.

Figure 4:
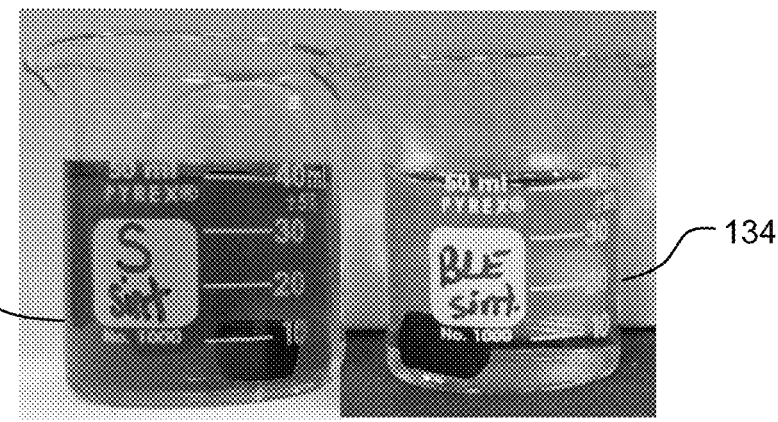
FIG. 4 is a visual comparison of two glass melts in accordance with the present disclosure.
Figure 5:
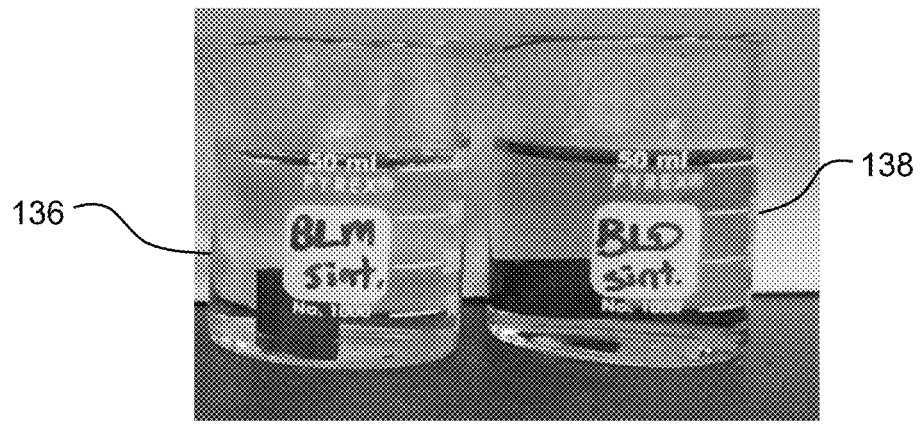
FIG. 5 is another visual comparison of two glass melts in accordance with the present disclosure.

Shown in FIGS. 4 and 5 are pictures of a bench aqueous durability test where a sintered frit pellet is placed in 90° C. deionized $H_2O$ for 48 hours, and then resistance to water attack assessed on the basis of the appearance of the resulting supernatant. Included in the test were the Sb-containing frit D1 shown in the beaker labeled 132, the Sb-free frit D24, shown in the beaker labeled 134, and two $TeO_2$-containing compositions, D32 shown in the beaker labeled 136 and D40 shown in the beaker labeled 138. All of the samples shown in FIGS. 4 and 5 were sintered on the same schedule (325° C. for 1 hour in air, followed by 400° C. for 2 hours in $N_2$). Performance of D32 and D40 compare favorably from an aqueous durability standpoint to either of the two compositions D1 and/or D24.

Figure 6:
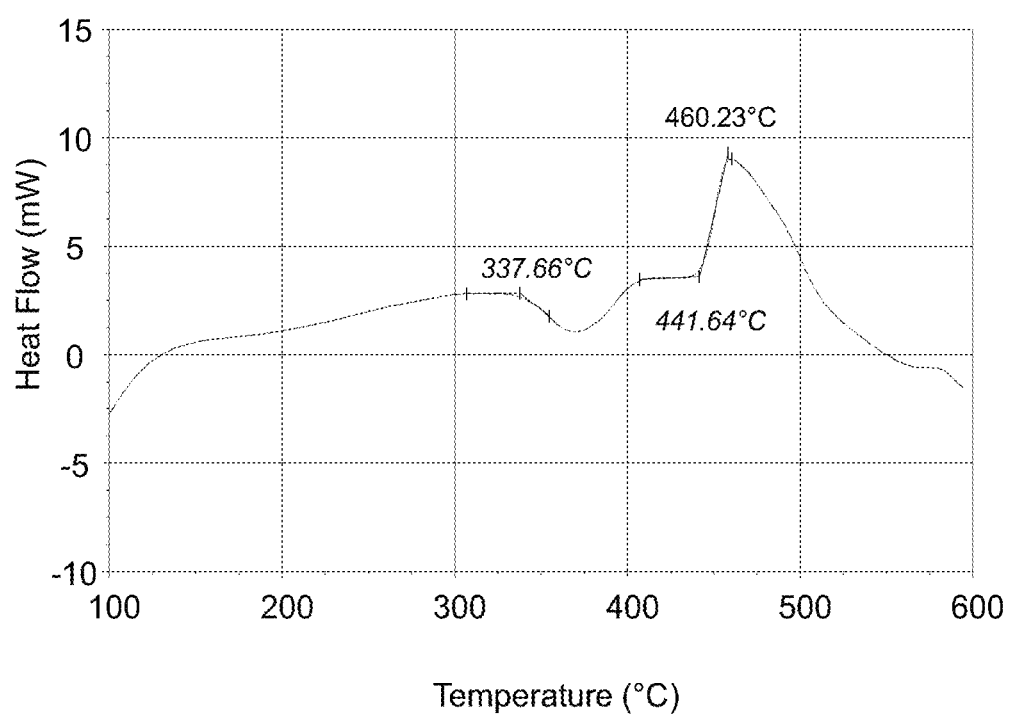
FIG. 6 is a graph of a differential scanning calorimetry measurement of an antimony-free glass suitable for use as a frit in accordance with an embodiment of the present disclosure.

FIG. 6 depicts a DSC curve for D40. The low $T_g$ of 338° C., combined with a reasonably large delta (Δ) of 104° C.

between $T_g$ and $T_x$ (onset), as well as the excellent aqueous durability in the bench screening test makes this frit an attractive Sb-free sealing frit for hermetic laser sealing of glass packages such as those useable for OLED display devices. Depending on the application, CTE-modifying fillers, either to increase or decrease CTE may be added as appropriate to frit compositions made from the glasses disclosed herein.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. An antimony-free glass comprising:
   $V_2O_5$ ≥30 and ≤60 mole %;
   $P_2O_5$ ≥5 mole % and ≤20 mole %;
   ZnO 0-10 mole %;
   $Bi_2O_3$ 0-5 mole %;
   $Fe_2O_3$ ≥10 mole % and ≤25 mole %;
   $TiO_2$ ≥5 mole % and ≤20 mole %;
   $TeO_2$ ≥5 mole % and ≤20 mole %; and
   wherein $TiO_2+Fe_2O_3$ is in a range from 20 mole % to 35 mole %.

2. The antimony-free glass according to claim 1, wherein:
   $V_2O_5$ ≥30 and ≤40 mole %; and
   $P_2O_5$ ≥5 mole % and ≤15 mole %.

3. The antimony-free glass according to claim 1, wherein:
   $V_2O_5$ ≥35 mole % and ≤40 mole %;
   $P_2O_5$ ≥8 mole % and ≤10 mole %; and
   ZnO ≥3 mole % and ≤7 mole %.

4. The antimony-free glass according to claim 1, wherein the glass has the following composition:
   $V_2O_5$ 40 mole %;
   $P_2O_5$ 10 mole %;
   ZnO 5 mole %;
   $Fe_2O_3$ 15 mole %;
   $TiO_2$ 15 mole %; and
   $TeO_2$ 15 mole %.

5. The antimony-free glass according claim 1, wherein the antimony-free glass has a $T_g$ ≤350° C.

6. The antimony-free glass according to claim 1, wherein the antimony-free glass comprises a glass frit.

7. The antimony-free glass according to claim 1, wherein the glass frit further comprises a CTE lowering filler.

8. A glass package comprising:
   a first glass plate;
   a second glass plate; and
   a frit that connects the first glass plate to the second glass plate and forms an hermetic seal therebetween, the frit including an antimony-free glass comprising:
   $V_2O_5$ ≥30 and ≤60 mole %;
   $P_2O_5$ ≥5 mole % and ≤20 mole %;
   ZnO ≥0 and ≤10 mole %;
   $Bi_2O_3$ ≥0 and ≤5 mole %;
   $Fe_2O_3$ ≥10 mole % and ≤25 mole %;
   $TiO_2$ ≥5 mole % and ≤20 mole %;
   $TeO_2$ ≥5 mole % and ≤20 mole %; and
   wherein $TiO_2+Fe_2O_3$ is in a range from 20 mole % to 35 mole %.

9. The glass package according to claim 8, wherein:
   $V_2O_5$ ≥30 and ≤40 mole %; and
   $P_2O_5$ ≥5 mole % and ≤15 mole %.

10. The glass package according to claim 8, wherein:
    $V_2O_5$ ≥35 mole % and ≤40 mole %;
    $P_2O_5$ ≥8 mole % and ≤10 mole %; and
    ZnO ≥3 mole % and ≤7 mole %.

11. The glass package according to claim 8, wherein the antimony-free glass has a Tg ≤350° C.

12. The glass package according to claim 8, wherein the frit comprises a CTE-lowering filler.

13. The glass package according to claim 8, further comprising an organic material disposed between the first and second glass plates.

14. The glass package according to claim 13, wherein the organic material comprises an organic light emitting diode.

15. A frit comprising:
    $V_2O_5$ ≥30 and ≤60 mole %;
    $P_2O_5$ ≥5 mole % and ≤20 mole %;
    ZnO ≥0 and ≤10 mole %;
    $Bi_2O_3$ ≥0 and ≤5 mole %;
    $Fe_2O_3$ ≥10 mole % and ≤25 mole %;
    $TiO_2$ ≥5 mole % and ≤20 mole %;
    $TeO_2$ ≥5 mole % and ≤20 mole %; and
    wherein $TiO_2+Fe_2O_3$ is in a range from 20 mole % to 35 mole %.

16. The frit according to claim 15, wherein:
    $V_2O_5$ ≥30 and ≤40 mole %; and
    $P_2O_5$ ≥5 mole % and ≤15 mole %.

17. The frit according to claim 15, wherein:
    $V_2O_5$ ≥35 mole % and ≤40 mole %;
    $P_2O_5$ ≥8 mole % and ≤10 mole %; and
    ZnO ≥3 mole % and ≤7 mole %.

18. The frit according to claim 15, wherein the frit comprises a CTE-lowering filler.

* * * * *